United States Patent
Hori et al.

[19]

[11] Patent Number: 6,130,846
[45] Date of Patent: Oct. 10, 2000

[54] SEMICONDUCTOR MEMORY DEVICE

[75] Inventors: Mineyuki Hori; Hiroyuki Takahashi, both of Tokyo, Japan

[73] Assignee: NEC Corporation, Tokyo, Japan

[21] Appl. No.: 09/245,322

[22] Filed: Feb. 5, 1999

[30] Foreign Application Priority Data

Feb. 6, 1998 [JP] Japan ................................. 10-026001

[51] Int. Cl.[7] .............................................. G11C 7/00
[52] U.S. Cl. ............................................ 365/203; 365/204
[58] Field of Search .................................. 365/203, 190, 365/189.01, 185.25, 204

[56] References Cited

U.S. PATENT DOCUMENTS

| | | | |
|---|---|---|---|
| 4,996,671 | 2/1991 | Suzuki et al. | 365/203 |
| 5,777,935 | 7/1998 | Pantelakis et al. | 365/203 |
| 5,946,264 | 8/1999 | McClure | 365/203 |

FOREIGN PATENT DOCUMENTS

| | | |
|---|---|---|
| 4-76894 | 3/1992 | Japan . |
| 6-20475 | 1/1994 | Japan . |

*Primary Examiner*—Tan T. Nguyen
*Attorney, Agent, or Firm*—Darryl G. Walker

[57] ABSTRACT

An approach to rapidly pre-charging bit lines (104a and 104b) after a write operation to a memory cell (128) is disclosed. Following a write operation, a Y-select signal (Yj) and its inverse (/Yj) are maintained in an active state for a given period of time, keeping the transistors within a column selecting circuit (102) turned on. Pre-charging circuits (106 and 108) are also turned on. Consequently, the bit lines (104a and 104b) are pre-charged by the bit line pre-charging circuit (106), and by the pre-charging circuit (108) by way of a read bus (124) and the column selecting circuit (102). Furthermore, a write amplifier (112) is also activated, resulting in the bit lines (104a and 104b) being further pre-charged by way of a write bus (126) and the column selecting circuit (102).

24 Claims, 8 Drawing Sheets

SEMICONDUCTOR MEMORY DEVICE

TECHNICAL FIELD

The present invention relates generally to static random access memories (SRAMs), and more particularly to write recovery circuits for providing high-speed SRAM operations.

BACKGROUND OF THE INVENTION

Static random access memories (SRAMs) generally include a number of SRAM cells arranged into an array. The typical SRAM cell includes a flip-flop (FF) having an output connected to a bit line through a switch. The switch is controlled by a word line. In this arrangement, data can be written into, or read from the FF by turning on the switch associated with the memory cell. Following a read or write operation to an SRAM cell, the switch within the SRAM cell is turned off, to thereby separate the output of the FF from the bit line. Once separated from a memory cell FF, a bit line can still maintain a logic potential. Accordingly, if another memory cell is immediately accessed, the residual logic potential on the bit line can change the logic within the FF of the newly accessed cell. To avoid such adverse consequences, bit lines can be "pre-charged" between read or write operations.

In the case where a SRAM includes bit lines pairs associated with each SRAM cell, a pre-charge operation can involve pre-charging the bit line pair by way of a pre-charge and equalization circuit. Such circuits can pre-charge both bit lines of the bit line pair to a "Vcc" voltage level, where Vcc is a supply voltage that is applied to the FF of the SRAM memory cells.

For a SRAM that utilizes bit line pairs in a read operation, once an SRAM cell is accessed, the potential of one of the bit lines of the bit line pairs will drop in potential. The potential drop is relatively small. However, in the case of a write operation, in the event the FF logic value must be inverted, the logic of a bit line may have to drop to a logic low level (GND). As a result, the function of pre-charging a bit line from such a logic low level (GND) to the high (Vcc) pre-charge level, can add a relatively large amount of time to a write operation. Looked at in another manner, following a write operation, a certain amount of time must pass before a subsequent read or write operation can be performed.

According to the present specification, the general time period that is required to pass following a write operation, before a subsequent read or write operation can be performed, is referred to as a "write recovery" time period. Thus, once a write operation has been performed, if a device switches to a subsequent read or write operation before the write recovery period, a mis-writing or misreading operation may occur. Furthermore, for consecutive write operations, the write recovery time can contribute to overall longer write periods, preventing higher speed write operations.

To improve write speeds, "write recovery" circuits are often employed. A number of conventional write recovery circuits will now be described.

Figure 9:
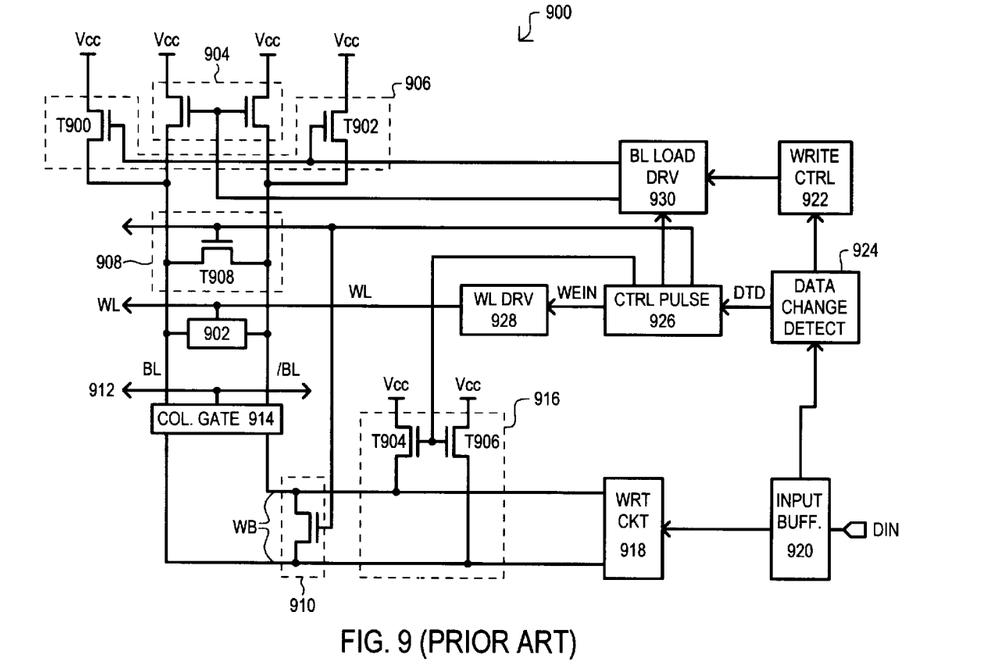
FIG. 9 is a block diagram of a conventional semiconductor memory device.

Referring now to FIG. 9, a conventional semiconductor memory device is set forth in a block diagram, and designated by the general reference character 900. The semiconductor memory device 900 appears in the Unexamined Japanese Patent Application No. 6-20475, filed on Jul. 3, 1992 and laid open to the public on Jan. 28, 1994. The semiconductor memory device 900 is shown to include a memory cell 902, a bit line load 904, a write bit line load 906, a bit line pair shorting circuit 908, a write line pair shorting circuit 910, a column select line 912, a column gate 914, a write data line load 916, a writing circuit 918, an input buffer 920, a write control circuit 922, a data change detect circuit 924, a control pulse generating circuit 926, a word line drive circuit 928, and a bit line load drive circuit 930. Also set forth in FIG. 9 are bit lines BL and /BL, a word line WL, and write lines WB.

Figure 10:
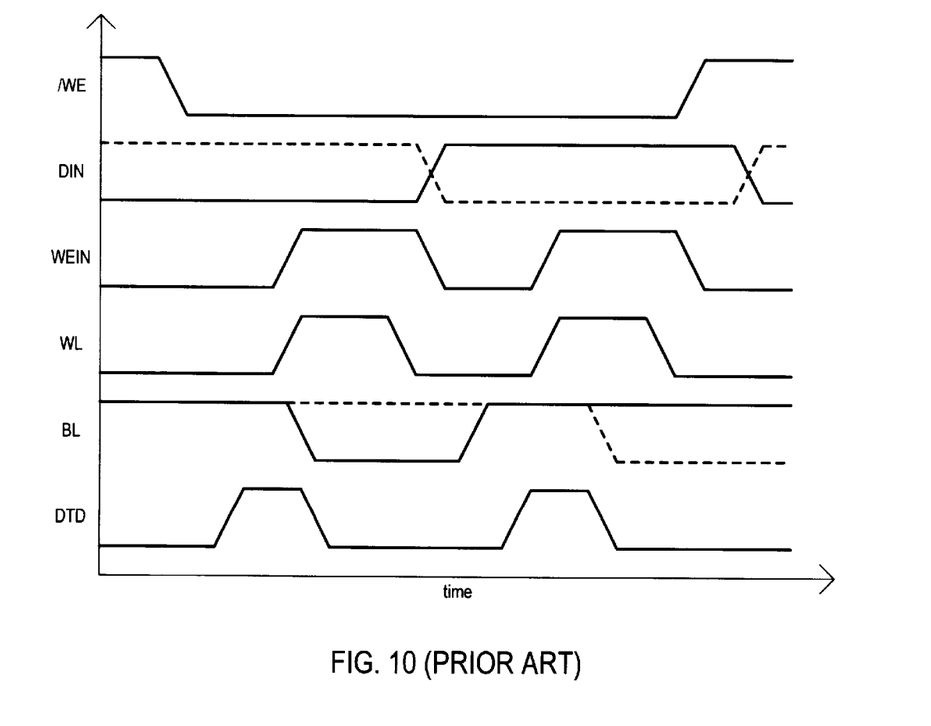
FIG. 10 is a timing diagram illustrating the operation of the various device parts of the semiconductor memory device of FIG. 9.

FIG. 10 is a timing diagram illustrating the operation of the various device parts of the semiconductor memory device of FIG. 9.

The conventional semiconductor memory device 900 of FIG. 9 is designed to allow a write operation to memory cell 902 to take place in response to changes in input data values or the application of a write enable signal. In particular, in response to an active write enable signal (/WE transitions low), or in response to a change in data values at the input buffer 920, the data change detect circuit 924 will activate a data change detect pulse (shown as DTD in FIG. 10). The DTD pulse is applied to the control pulse generating circuit 926, which generates a control signal pulse (shown as WEIN in FIG. 10). The WEIN signal pulse is received by the word line drive circuit 928, which activates the word line WL. The activation of word line WL results in the selection of memory cell 902. Data can then be written into the memory cell 902.

Once the writing of data into memory cell 902 has been completed, the write control circuit 922 applies control signals to the bit line load driving circuit 930, which in turn, deactivates the bit line load 904 and the writing circuit 918.

The control pulse generating circuit 926 and word line drive circuit 928 are constructed in such a manner that once the write operation has been completed, the word line WL falls, preventing data from being further written into the memory cell 902. Once in this state, the control pulse generating circuit 926 provides another control pulse to the bit line load driving circuit 930. In response to the signal provided by the control pulse generating circuit 926, the bit line load driving circuit 930 activates the write bit line load 906. Consequently, transistors T900 and T902 turn on, pre-charging the bit lines BL and /BL to the level Vcc.

Also following the completion of a write operation, the control pulse generating circuit 926 outputs a third control signal that is applied to write data line load 916 and a fourth control signal that is applied to the bit line shorting circuit 908. In response to the third control signal, the write data line load 916 is activated, turning on transistors T904 and T906, and thereby raising the voltage of the write lines WB. In response to the fourth control signal, the bit line shorting circuit 908 is activated, turning on transistor T908. Consequently, the bit lines (BL and /BL) are shorted together, and the write lines (WB), due to the operation of the column gate 914, are also shorted together.

In this way a pre-charging operation is performed that is capable of rapidly raising a bit line (BL or /BL) from a low logic level, and thereby achieving a desirable write recovery time.

A drawback to the pre-charge approach set forth in FIG. 9 is the delay that can be introduced by the transistors of the load circuits (904, 906 and 916). As set forth in FIG. 9, the bit lines (BL and /BL) and write lines (WB and /WB) are pre-charged by activating n-channel transistors. In particular, bit lines (BL and /BL) are pre-charged by turning on transistors T900 and T902, and write lines (WB and /WB) are pre-charged by turning on transistors T904 and T906. In the case where a bit line (or a write line) is pre-charged from a logic low level (V=0 V) to a logic high level (Vcc), while the bit line (or write line) has a relatively low voltage, the associated n-channel transistor will remain activated, drawing current and pre-charging the bit line (or write line). However, as the voltage of the bit line (or write line) rises to the Vcc-Vtn level (where Vtn is the threshold voltage of the n-channel transistor), the n-channel transistor will turn off, preventing current from being drawn through the n-channel transistor. This can delay the overall pre-charge operation.

Figure 11:
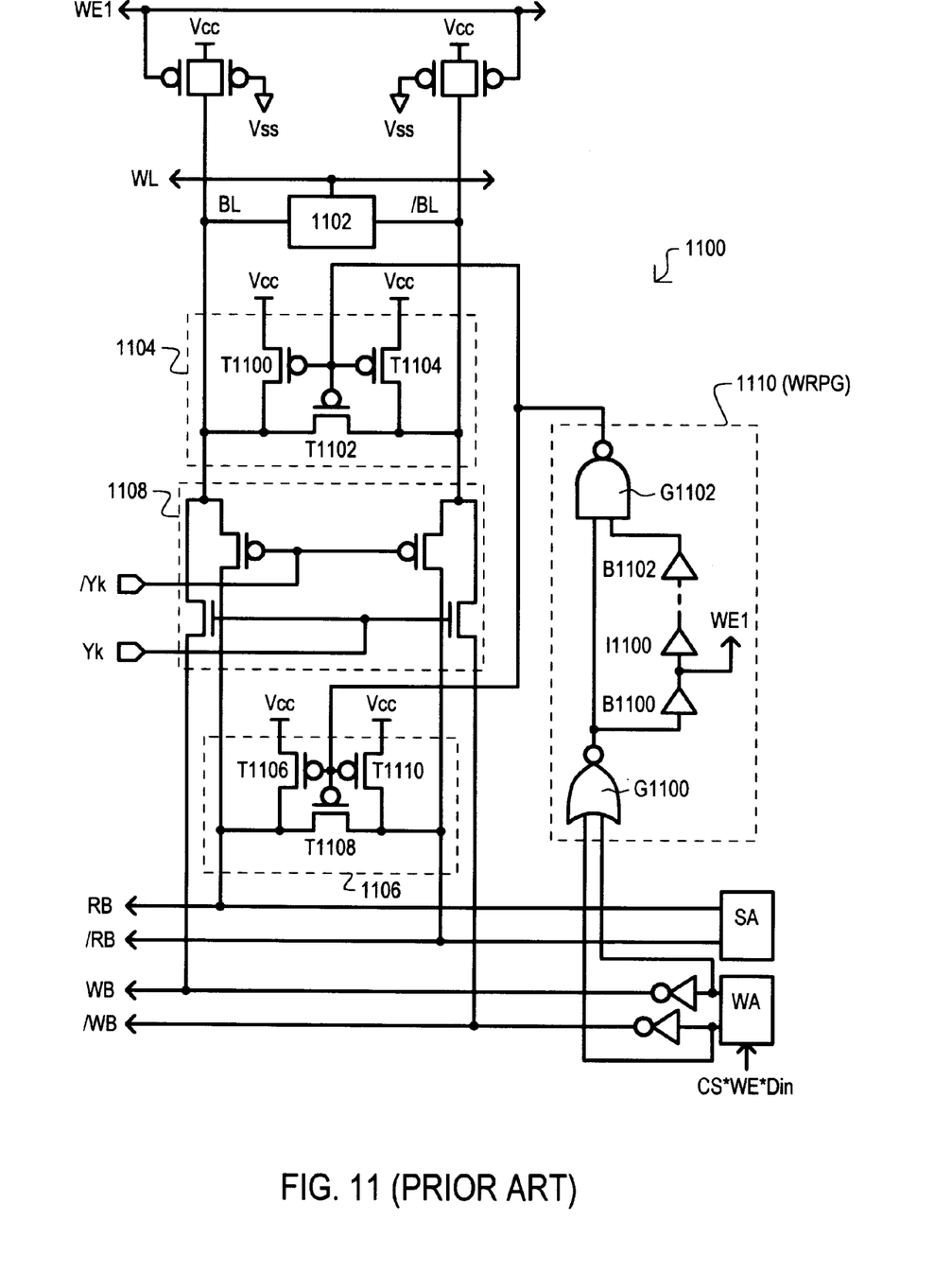
FIG. 11 is a block diagram of another conventional semiconductor memory device.

Referring now to FIG. 11, a block diagram of another conventional semiconductor memory device is set forth. The semiconductor memory device illustrated in FIG. 11 appears in the Unexamined Japanese Patent Application No. 4-76894, filed on Jul. 7, 1990 and laid open to the public on Mar. 11, 1992. The semiconductor memory device is designated by the general reference character 1100, and is shown to include a memory cell 1102, pre-charging circuits (1104 and 1106), a column selecting circuit 1108, and a write recovery pulse generating circuit 1110. In addition, FIG. 11 illustrates a bit line pair (BL and /BL), a word line WL, write bus lines (WB and /WB), read bus lines (RB and /RB), a sense amplifier SA, and a write amplifier WA.

Figure 12:
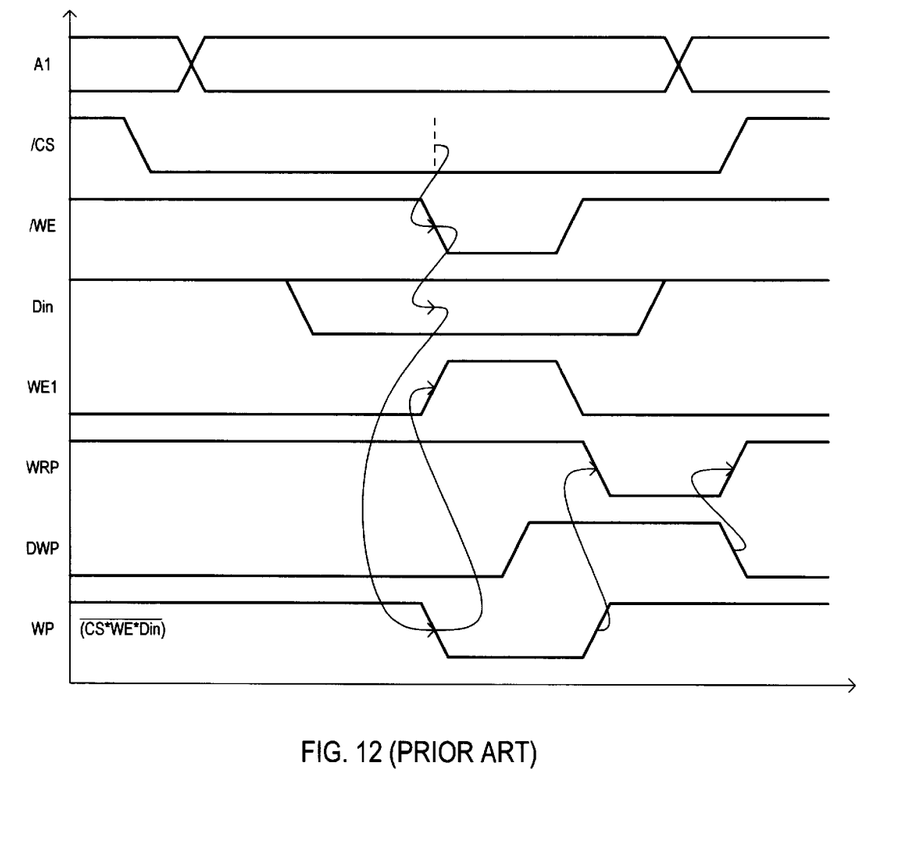
FIG. 12 is a timing diagram illustrating the operation of the various device parts of the semiconductor memory device of FIG. 11.

FIG. 12 is a timing diagram illustrating the operation of the various device parts of the semiconductor memory device of FIG. 11.

The write amplifier circuit WA provides output signals to the write bus (WB and /WB) according to the logical product of a chip select signal (shown as /CS in FIG. 12), a write enable signal (shown as /WE in FIG. 12), and a data input signal (shown as Din in FIG. 12). A WRPG circuit 1110 is provided for each write bus (WB and /WB). The WRPG circuit 1110 is shown to include an input NOR gate G1100 having inputs coupled to the write bus (WB and /WB), and a delay circuit that includes buffers (B1100 and B1102) and inverter I1100. In addition, the WRPG circuit 1110 includes an output NAND gate G1102. In this arrangement, the write amplifier WA provides output signals to the WRPG circuit 1110 in synchronism with a write operation to memory cell 1102.

Prior to a write operation, the write bus lines (WB and /WB) are both low. During a write operation, according to changes in an applied address (shown as waveform A1 in FIG. 12) the word line WL is driven to a logic high level. In addition, in order to drive one of the bit lines (BL or /BL) high, one of the outputs from the write amplifier WA will be driven high. Consequently, one of the write bus lines (WB and /WB), which were both previously low, will be driven high. The low-to-high transition in one of the bus lines (WB and /WB) results in one of the inputs to gate G1100 going from low to high. Consequently, the output of gate G1100 (shown as WP in FIG. 12) will transition from high to low.

The high-to-low transition in the output of gate G1100 is applied as one input to gate G1102. In addition, the high-to-low transition is applied to the other input by way of delay circuit (B1100, I1100 ... B1102). In the particular arrangement of FIG. 11, delay circuit inverts and delays the output of gate G1100. As a result, the high-to-low transition at the output of gate G1100 will generate a low-going pulse at the output of gate G1102. The output of gate G1102 is shown as waveform WRP in FIG. 12, and is applied to the pre-charging circuits 1104 and 1106. In this arrangement, on the terminating (high-going) edge of the WP signal, which indicates the completion of a write operation, a low-going WRP pulse is generated. The low-going WRP pulse turns on transistors T1100 to T1104 within pre-charge circuit 1104, and turns on transistors T1106 to T1110 within pre-charge circuit 1106.

For conventional semiconductor memory devices such as that illustrated by FIG. 11, the arrangement of multiple memory blocks can result in a single write recovery pulse (WRP) arriving to different memory blocks at different times. To provide a more uniform response, a write recovery pulse generating circuit (such as 1110) can be supplied to each write bus (WB and /WB). In addition, pre-charge circuits (such as 1104 and 1106) are supplied for the bit lines (BL and /BL) and for the read bus (RB and /RB).

A drawback to the pre-charge approach set forth in FIG. 11 is the area required for implementing such a scheme. In particular, for each bit line pair (BL and /BL) a pre-charge circuit 1104, must be provided. In addition, for each read bus (RB and /RB), another pre-charge circuit 1106 must also be provided. Furthermore, in order to limit differences in the timing of write pulses (such as WRP), a write recovery pulse generating circuit 1110 is required for each write bus (WB and /WB). Each such circuit (1104, 1106 and 1110) requires a certain amount of area on a semiconductor memory device. Consequently, as memory devices are scaled up in size, the number of bit lines, read bus lines, and write bus lines will increase. This requires a corresponding number pre-charge circuits (1104 and 1106) and write recovery pulse generating circuits 1110, which requires additional area. Additional device area can lead to increased manufacturing costs.

As data processing devices, such as central processing units (CPUs), continue to have higher operating speeds, memory devices are required to operate at a correspondingly faster speed. Accordingly, write recovery time periods are of increasing importance.

In light of the need for faster semiconductor memory devices, and the undesirability of increasing circuit area, it would be desirable to arrive at some way of decreasing the write recovery period of a semiconductor memory device. At the same time, such an approach should not result in significant increases in the overall area of the semiconductor memory device.

SUMMARY OF THE INVENTION

According to the disclosed embodiments, a semiconductor memory device includes a plurality of memory cells, word lines for selecting memory cells in a row direction, bit lines for selecting memory cells in a column direction, a read bus for reading data from the memory cells through the bit lines on the basis of a clock signal, and a write bus for writing data to the memory cells through the bit lines on the basis of the clock signal. In addition, the semiconductor memory device includes a first pre-charging means for pre-charging the bit lines after data is written into the memory cells, and a second pre-charging means for pre-charging the read bus or the write bus after data is written into the memory cells, wherein the bit lines are pre-charged by the first and second pre-charging means.

Further according to the disclosed embodiments, a column select circuit includes transistors of a first conductivity type disposed between the bit lines and the read bus, while transistors of a second conductivity type are disposed between the bit lines and the write bus.

Further according to the disclosed embodiments, the transistors of a first conductivity type are n-channel insulated gate field effect transistors (IGFETs) and the transistors of a second conductivity type are p-channel IGFETs.

Further according to the disclosed embodiments, a signal extending means is provided that extends a pulse width of a column select signal. The transistors of a column select circuit are driven by the column select signal.

Yet further according to the disclosed embodiments, signal output means are provided for outputting a signal for a predetermined period of time after the completion of a write operation to a memory cell. In addition, signal extending means are provided for extending a pulse width of the output signal from the signal output means. The transistors of a column select circuit are driven by the extended pulse provided by the signal extending means.

Still further according to the disclosed embodiments, the first pre-charging means is a bit line pre-charging circuit. The bit line pre-charging circuit being situated apart from the transistors of the column select circuit with respect to the bit lines.

Still further according to the disclosed embodiments, the bit line pre-charging circuit is disposed at one end of the bit lines, and the transistors of the column select circuit are disposed at the other end of the bit lines.

Still further according to the disclosed embodiments, a signal extending means includes a delay circuit that delays a clock signal, a logical sum circuit that outputs the logical sum of the clock signal and the delayed clock signal, and a logical product circuit that outputs the logical product of the output of the logical sum circuit and a column select signal.

Still further according to the disclosed embodiments, a signal extending means includes a delay circuit that extends the clock signal, and a logical product circuit that outputs the logical product of the output of the delay circuit and a column select signal.

Yet further according to the disclosed embodiments, the clock signal is an externally applied clock signal.

Yet further according to the disclosed embodiments, the clock signal is generated in response to address signals that select a column within the semiconductor memory device.

DETAILED DESCRIPTION OF THE EMBODIMENTS

Figure 1:
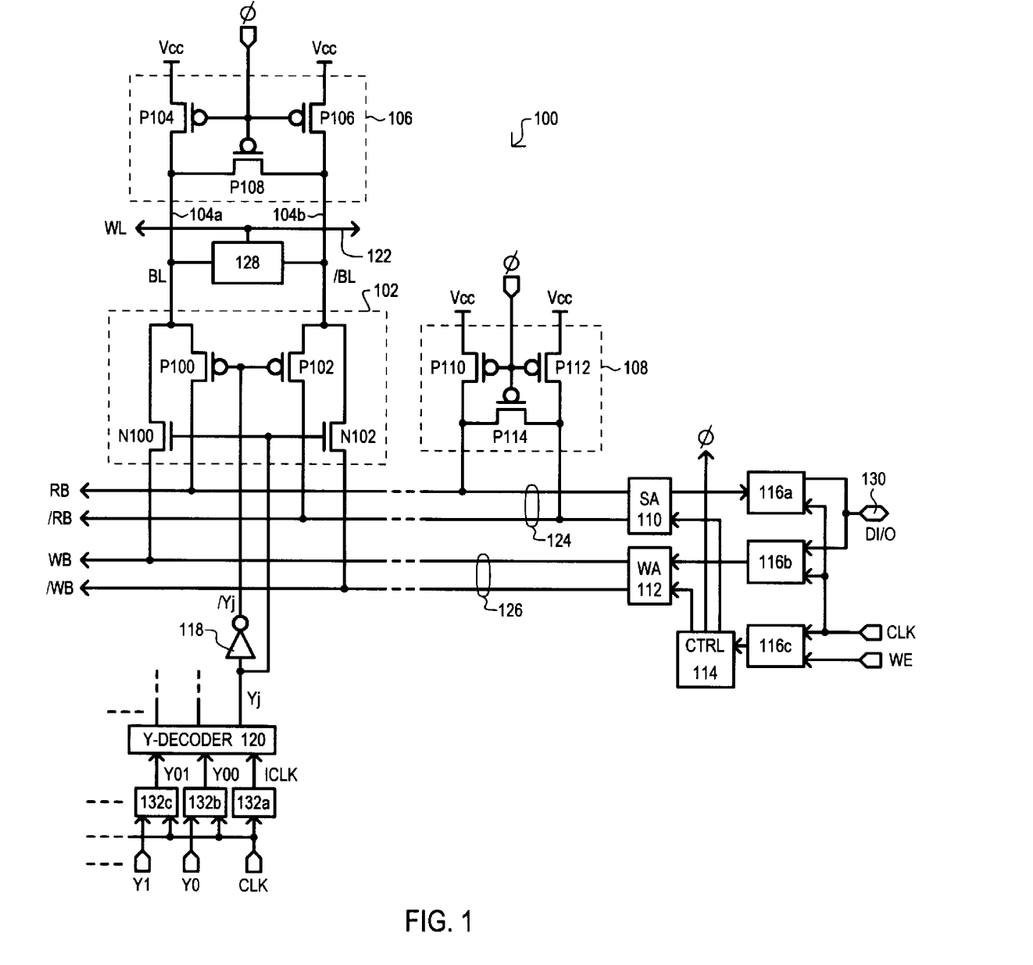
FIG. 1 is a block diagram of a semiconductor memory device according to a first embodiment.

Various embodiments of the present invention will now be described in with reference to a number of figures. FIG. 1 is a block diagram illustrating a semiconductor memory device according to a first embodiment. The first embodiment illustrates a synchronous static random access memory (SRAM) which generates an internal clock signal ICLK from a external clock CLK. In such a synchronous SRAM, read operations from, and write operations to a memory cell are performed in synchronism with the ICLK signal.

The semiconductor memory device of FIG. 1 is designated by the general reference character 100, and is shown to include a column selecting circuit 102 that selects bit lines 104a and 104b), a bit line pre-charging circuit 106, a pre-charging circuit 108 connected to a read bus (RB and /RB), a sense amplifier 110, a write amplifier 112, a control circuit 114, a number of buffers 116a–116c, an inverter 118, and a Y-decoder 120. The first embodiment 100 further includes a word line 122, a read bus 124, and a write bus 126. As shown in FIG. 1, the bit lines are further identified as BL and /BL, the word line is further identified as WL, two read bus 124 lines are shown as RB and /RB, and two write bus 126 are shown as WB and /WB. The control circuit 114 is shown to provide a pre-charge signal identified as "φ."

In FIG. 1, a memory cell 128 is situated between bit lines 104a and 104b. The memory cell can include a flip-flop (FF) having two outputs. One output can be connected to one bit line (104a or 104b) through a switch device, while the other output can be connected to the other bit line (104a or 104b) through another switch device. The two outputs of the FF will provide complementary output values. Thus, if one output has a logic high level, the other will have a logic low level. When the word line 122 is activated, the switches within the memory cell 128 can be turned on, and the data stored within, placed on the bit lines (104a and 104b). It is understood that while only one memory cell 128 is set forth in FIG. 1, the semiconductor memory device 100 can include a number of such memory cells arranged in a matrix having rows and columns. Those memory cells in the same column are commonly coupled to the same bit lines. Those memory cells in the same row are commonly coupled to the same word lines.

The column selecting circuit 102 is shown to include two p-channel metal(conductor)-oxide(insulator)-semiconductor (PMOS) transistors (P100 and P102) and two n-channel MOS transistors (NMOS) transistors (N100 and N102). The drains of transistors P100 and P102 are connected to the bit lines 104a and 104b, respectively, and the sources of transistors P100 and P102 are connected to the read bus lines RB and /RB, respectively. The gates of transistors P100 and P102 are connected to the output of inverter 118 (which provides a column select signal /Yj). The drains of transistors N100 and N102 are also connected to the bit lines 104a and 104b, respectively. The sources of transistors N100 and N102 are connected to write bus lines WB and /WB, respectively. The gates of transistors N100 and N102 are connected to an output of the Y-decoder 120 (which provides a column select signal Yj).

When the column select signal Yj is active (high in the particular embodiment of FIG. 1) and the column select signal /Yj is active (low in the particular example of FIG. 1) all of the transistors (P100, P102, N100 and N102) within the column selecting circuit 102 are activated. Conversely, when the Yj and /Yj signals are inactive (low and high, respectively), transistors (P100, P102, N100 and N102) are all inactive.

The pre-charging circuits (106 and 108) are shown to each include two PMOS pull-up transistors (P104 and P106) and (P110 and P112), and an equalizing transistor P108 and P114. The drains of transistors P104 and P106 are connected to bit lines 104a and 104b, respectively, and the drains of transistors P110 and P112 are connected to read bus lines RB and /RB, respectively. The sources of transistors P104, P106, P110 and P112 are coupled to a supply voltage Vcc. In addition, the gates of the transistors P104 to P114 receive the pre-charge signal φ.

In the resulting arrangement of FIG. 1, when the pre-charge signal φ is active (at a logic low level in FIG. 1), transistors P104 to P108 within pre-charge circuit 106 and transistors P110 to P114 within pre-charge circuit 108 are activated, resulting in the bit lines (104a and 104b) and read bus 124 being pre-charged. Conversely, when the pre-charge signal φ is inactive, transistors P104 to P108 and P110 to P114 are inactive.

As noted above, the pre-charge signal φ is generated by the control circuit 114. In the first embodiment 100 the pre-charge signal φ is activated in synchronism with the ICLK signal and will be supplied to pre-charging circuits (such as 106 and 108 in FIG. 1) of a memory block. The memory block will be selected by a column decode signal Yd, as will be described at a later point herein.

It is understood that while the pull-up transistors P104, P106, P110 and P112 and equalizing transistors P108 and P114 are collectively referred to as pre-charging circuits (106 and 108), the pre-charging circuits (106 and 108) can be structured to include only pull-up transistors. In addition, while one pre-charging circuit (such as 108) may be provided to a read bus 124, if required, a number of pre-charging circuits can be connected to a read bus.

The sense amplifier 110 is shown to have an input connected to the read bus 124 and an output connected to input buffer 116a. The sense amplifier 110 is controlled by a read enable signal provided from the control circuit 114 and is activated only during a read operation. When activated, the sense amplifier 110 amplifies a signal that is read out from memory cell 128, thereby determining the logic value output from the memory cell 128. This logic value is output from the sense amplifier 110 and further amplified by input buffer 116a. The amplified logic value from the buffer 116a is then output to a data input/output (I/O) 130 in synchronism with the CLK signal.

It is noted that, while not shown in FIG. 1, the sense amplifier 110 can be connected to a number of column selecting circuits (such as 102). In which case one pair of bit lines (BL and /BL) will be connected to the sense amplifier 110 by a column selecting signal (such as Yj and /Yj). Accordingly, FIG. 1 can be conceptualized as illustrating the connection of one particular set of bit lines (104a and 104b) to the sense amplifier 110.

The write amplifier 112 is shown to have an input connected to buffer 116b and an output connected to the write bus 126. Data is input to the buffer 116b from the data I/O 130 in synchronism with the CLK signal. The buffer 116b buffers the input data and applies it to the write amplifier 112. The write amplifier 112 also amplifies the input data and outputs it to the write bus 126. The input data will then be stored within memory cell 128 by way of column selecting circuit 102. The write amplifier 112 is activated in response to an internal write enable signal provided from the control circuit 114. As a result, the write amplifier 112 is activated only during a write operation.

It is noted that, while not shown in FIG. 1, the write amplifier 112 can be connected to a number of column selecting circuits (such as 102). In which case one pair of bit lines (BL and /BL) will be connected to the write amplifier 112 by a column selecting signal (such as Yj and /Yj). Accordingly, FIG. 1 can be conceptualized as illustrating the connection of one particular set of bit lines (104a and 104b) to the write amplifier 112.

The control circuit 114 is shown to have an input connected to buffer 116c and outputs that provide the pre-charge signal φ to the pre-charge circuits (106 and 108), an internal read enable signal to the sense amplifier 110, and a internal write enable signal to the write amplifier 112. Buffer 116c receives an externally applied write enable signal (WE), buffers it, and provides it to the control circuit 114.

Having described the general arrangement of a first embodiment 100, a read operation for the first embodiment 100 will now be described.

A read operation can begin with an address signal (not shown) being applied to the semiconductor memory device. The applied address can be separated into a row address and a column address, which can then be latched. The latched row address is decoded by an X-decoder (not shown), which results in the activation of a word line (such as 122). In the particular arrangement of FIG. 1, an activated word line is driven to a high logic level.

Latched column address signals (such as Y0 and Y1) and a clock signal CLK can be amplified by decoder buffers (132a–132c). The amplified column address signals (such as Y00 and Y01) and the amplified clock signal (ICLK) can then be applied, in synchronism with the CLK signal, to the Y-decoder 120. The Y-decoder 120 decodes the column address values, in synchronism with the ICLK signal, to activate a particular Y-select signal (such as Yj and /Yj). The remaining Y-select signals will be inactive. In this manner, in response to an applied column address, the transistors (such as P100, P102, N100 and N102) in the column selecting circuit corresponding to the activated Y-select signal will be turned on, while the transistors in the column selecting circuits corresponding to inactive Y-select signal will be turned off. In the particular arrangement of FIG. 1, the Yj and /Yj Y-select signals correspond to column selecting circuit 102.

Thereafter, the control circuit 114 activates the sense amplifier 110 in synchronism with the ICLK signal (which is generated from the CLK signal). The data is then read from memory cell 122 by way of bit lines (104a and 104b), the column selecting circuit 102, the read bus 124, the sense amplifier 110 and the buffer 116a.

Following the reading of data from the memory cell 128, the control circuit 114 activates the pre-charge signal φ (drives it to a logic low). Consequently, pre-charging circuits (106 and 108) are activated, pre-charging the bit lines (104a and 104b) and read bus 124.

Having described a read operation, a write operation for the first embodiment 100 will now be described.

A write operation can include the word line 122 going to a logic high level in response to an applied external address. A column selecting circuit (such as 102) can be selected according to an activated column select signal (such as Yj and /Yj) from Y-decoder 120. Transistors within the activated column selecting circuit (such as P100, P102, N100 and N102) are thus turned on. In addition, the pre-charge signal φ returns to an inactive state (goes to a logic high), turning off the transistors within the pre-charging circuits (such as 106 and 108).

Thereafter, a write enable signal is input to buffer 116c, and the control circuit 114 outputs an active internal write enable signal to the write amplifier 112. As a result, a data value applied at data I/O 130 is written into memory cell 128 by way of buffer 116b, write amplifier 112, write bus 126, column selecting circuit 102, and bit lines (104a and 104b).

Following the writing of data to the memory cell 128, the control circuit 114 once again activates the pre-charge signal φ (drives it to a logic low). Consequently, pre-charging circuits (106 and 108) are activated, pre-charging the bit lines (104a and 104b) and read bus 124 once again.

Once the writing of data has been completed, the activated column select signals are maintained in an activated state. For example, in the event the Yj and /Yj signals were activated in a write operation, signal Yj will remain high while signal /Yj will remain low. The pre-charge signal φ will be low, resulting in pre-charging circuits (106 and 108) being activated. In this way, the bit lines (104a and 104b) are pre-charged by pre-charging circuit 106. In addition, while the pre-charge signal φ is low, the write enable signal provided by the buffer 116c is applied to the control circuit 114 which places the write amplifier 112 in the inactive state. However, in the inactive state, the write amplifier 112 drives its associated write bus lines (WB and /WB) to the logic high level. Consequently, the bit lines (104a and 104b) are further pre-charged by logic high levels on the write bus 126 by way of the column selecting circuit 102.

Figure 3:
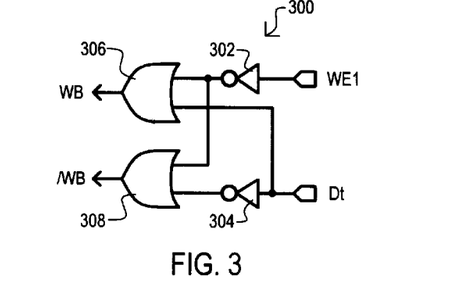
FIG. 3 is a circuit diagram illustrating the structure of a write amplifier that may be used in various embodiments.

Referring now to FIG. 3, a circuit diagram is set forth illustrating the structure of a write amplifier that may be used in various embodiments. The write amplifier is designated by the general reference character 300, and is shown to include two inverters 302 and 304, and two OR gates 306 and 308.

An internal write enable signal WE1 is inverted by inverter 302 and applied as an input to both OR gates (306 and 308). A data signal Dt, obtained by buffer 116b amplifying a data signal at data I/O 130, is applied as another input to OR gate 306. The Dt signal is inverted by inverter 304 and then applied as another input to OR gate 308. The output of OR gate 306 is connected to a first write bus line WB, while the output of OR gate 308 is connected to a second write bus line /WB.

When the internal write enable signal WE1 is high during a write operation, the output of inverter 302 will be low. In this arrangement, the write bus lines (WB and /WB) will be driven according to the data input value Dt. In particular, when the Dt signal is at a logic high level, the output of OR gate 306 (the write bus line WB) will be high, and the output of OR gate 308 (the write bus line /WB) will be low. Conversely, when the Dt signal is at a logic low level, the output of OR gate 306 (WB) will be low, while the output of OR gate 308 (/WB) will be high.

When the internal write enable signal WE1 transitions low upon the completion of a write operation, the output of inverter 302 goes to a logic high level. In this arrangement, the outputs of both OR gates (306 and 308) are driven to a high logic level, thereby pre-charging the write bus lines (WB and /WB). In this arrangement, regardless of whether the Dt signal is high or low, the output of both OR gates (306 and 308) will be high.

In this manner, the write amplifier 300 of FIG. 3 is capable of pre-charging write buses (WB and /WB) without the addition of a pre-charging circuit dedicated to the write bus (WB and /WB). Furthermore, by connecting bit lines to the write bus (WB and /WB), by way of a column selecting circuit, as just one example, the bit lines can be pre-charged using a write amplifier.

Accordingly, in the first embodiment, once the writing of data has been completed, the bit lines BL and /BL are pre-charged by bit line pre-charging circuit 106, pre-charging circuit 108, and further by write amplifier 112. This can result in rapid pre-charging of the bit lines.

In addition, since at least one pre-charging circuit (such as 108) can be provided to pre-charge a read bus 124, and the write amplifier can be used to pre-charge the write bus 126 and the bit lines (104a and 104b), rapid pre-charging can be accomplished without necessarily using a pre-charging circuit for the bit lines (such as 106) and without significantly increasing the circuitry of a semiconductor memory device.

Furthermore, in the first embodiment 100, the bit lines (104a and 104b) are connected to the read bus 124 by way of NMOS transistors N100 and N102 and to the write bus 126 by way of PMOS transistors P100 and P102. Accordingly, in a pre-charging operation, initial pre-charging is accomplished at a high speed by the NMOS transistors (N100 and N102). Pre-charging to a potential close to Vcc can then be accomplished by the PMOS transistors (P100 and P102). In this way, pre-charging can be conducted in an efficient fashion, and the it lines pre-charged at a high speed.

Figure 2:
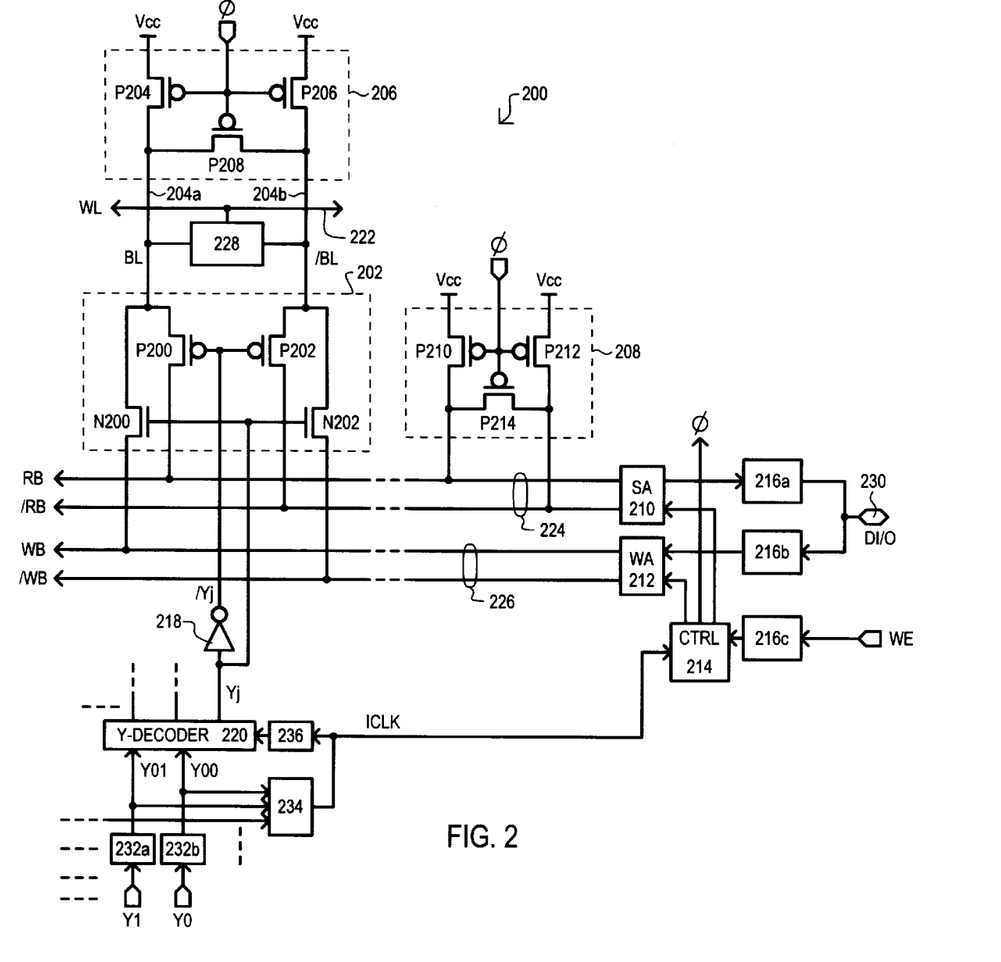
FIG. 2 is a block diagram illustrating a semiconductor memory device according to a second embodiment.

Referring now to FIG. 2 is a block diagram is set forth illustrating a semiconductor memory device according to a second embodiment. The second embodiment illustrates an example of an asynchronous SRAM. The asynchronous SRAM generates a clock signal by detecting a change in applied external address signal. In such an arrangement the use of an external clock is not required.

The second embodiment is set forth in FIG. 2 and designated by the general reference character 200. The second embodiment 200 includes many of the same general constituents as the first embodiment 100, to that extent like constituents will be referred to by the same reference character, but with the first digit being a "2" instead of a "1."

Address signals (Y0 and Y1) are buffered by address buffers (232a and 232b) and then applied to a clock generating circuit 234. In response to variations in address signals (such as the Y0 and Y1 signals), the clock generating circuit 234 activates an internal clock signal ICLK. Thus, the ICLK signal of the second embodiment 200 will be an asynchronous clock signal, unlike the synchronous clock signal of FIG. 1. The clock signal is then applied to a Y-decoder 220 and a control circuit 214. In response to the clock signal, the Y-decoder 220 activates one of a number of Y-select signals (such as Yj and /Yj), while the control circuit 214 provides a read enable signal to a sense amplifier 210, an internal write enable signal to a write amplifier 212, and a pre-charge signal φto a bit line pre-charge circuit 206 and a pre-charge circuit 208.

In the arrangement of FIG. 2, reading data from and writing data to a memory cell 228 is done in synchronism with the asynchronous ICLK signal. In addition, pre-charging of bit lines (204a and 204b) operations are also done in synchronism with the asynchronous ICLK signal.

Unlike the first embodiment 100, the second embodiment 200 includes decoder buffers 232a and 232b that do not operate in response to a synchronous clock signal (such as CLK in FIG. 1), but instead operate in response to a received address.

Figure 4:
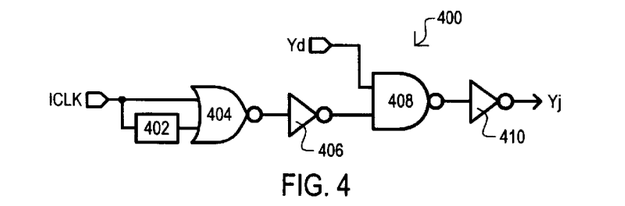
FIG. 4 is a block diagram illustrating a structure of a Y-decoder according to one embodiment.

Referring now to FIG. 4, a block diagram is set forth illustrating a structure of a Y-decoder according to one embodiment. The Y-decoder may be used in the disclosed semiconductor memory device embodiments. The Y-decoder is designated by the general reference character 400, and shown to include a delay circuit 402, a NOR gate 404, a first inverter 406, a NAND gate 408, and a second inverter 410. The Y-decoder structure set forth in FIG. 4 provides a Y-select signal Yj, and has the function of holding the Yj signal output for a predetermined time period following a write operation. The delay function is realized by the delay circuit 402.

In operation, a Y-decoder decodes applied address values (such as Y00 and Y01) to generate a Yd value. The Yd value and a clock signal ICLK are received by the Y-decoder 400. The Yd value is received at the NAND gate 408. The ICLK signal is applied as one input to NOR gate 404 and to the second input of NOR gate 404, by way of delay circuit 402. The output of NOR gate 404 is inverted by first inverter 406. The output of first inverter 406 is applied as a second input to NAND gate 408. The output of NAND gate 408 is inverted by inverter 410. The output of inverter 410 is the Y-decode signal Yj, which can be applied to a column select circuit.

Figure 5:
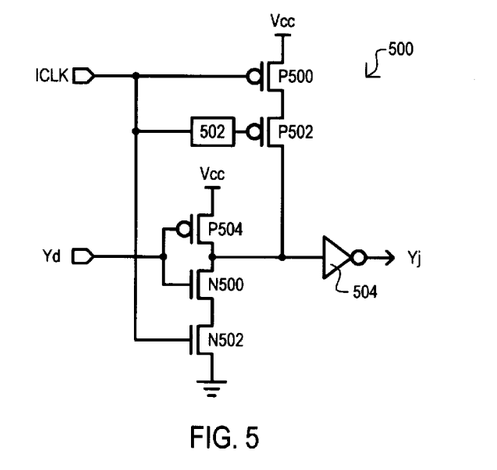
FIG. 5 is a circuit diagram illustrating a structure of a Y-decoder according to another embodiment.

Referring now to FIG. 5, a circuit diagram is set forth illustrating a structure of a Y-decoder according to a second embodiment. The Y-decoder of FIG. 5 may be used in the various semiconductor memory device embodiments disclosed. The Y-decoder is designated by the general reference character 500, and shown to include a delay circuit 502, an inverter 504, three PMOS devices (P500, P502, P504), and two NMOS devices (N500 and N502). As shown in FIG. 5, transistors P504, N500 and N502 have their source-drain paths arranged in series. The gates of transistors P500 and N502 receive the ICLK signal directly, while the gate of transistor P502 receives the ICLK signal by way of delay circuit 502. The gates of transistors P504 and N500 receive the Yd value. The drain of transistor P502 and the common drains of transistors P504 and N500 are connected to the input of inverter 504. The sources of transistors P500 and P504 are commonly connected to a power supply voltage Vcc, and the source of transistor N502 is connected to a GND power supply voltage.

Figure 6:
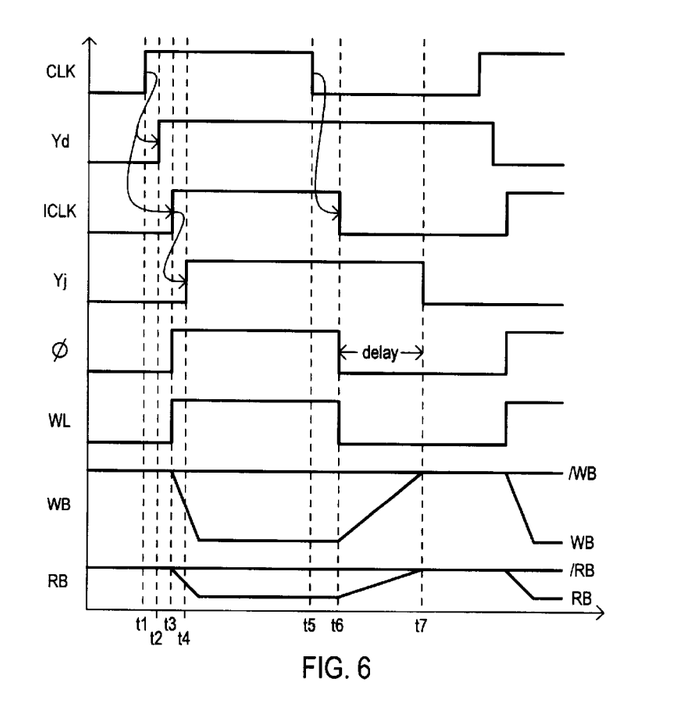
FIG. 6 is a timing diagram illustrating the operation of a Y-decoder, such as those set orth in FIGS. 4 and 5.

Referring now to FIG. 6, a timing diagram is set forth illustrating the operation of a Y-decoder, such as that set forth in FIGS. 4 and 5, as well as the illustrating of the first embodiment 100 set forth in FIG. 1. FIG. 6 includes a CLK waveform which describes an externally applied clock signal, a Yd value, an internal clock value ICLK, the Y-decoder signal Yj, the pre-charge signal φ, the response of the word line WL, the response of the write bus (shown as WB), and the response of the read bus (shown as RB).

Referring now to FIG. 1 in conjunction with FIG. 6, the CLK signal is applied to decoder buffers (132a–132c). At time t1, the CLK signal transitions from low to high. As a result, column address values (such as Y0 and Y1) are inputted to the decoder buffers 132b and 132c, which then output the Y00 and Y01 value to the Y-decoder 120. While not shown in FIG. 6, the address values (Y0 and Y1) are applied to the decoder buffers (132b and 132c) slightly before the low-to-high transition at time t1. In addition, the CLK signal is buffered in decoder buffer 132a to generate the internal clock signal ICLK.

The Y-decoder 120 decodes the buffered address values (such as Y00 and Y01) and outputs a column decode value, such as Yd. The Yd signal will correspond to a pair of bit lines. The Yd signal is shown to go high at time t2 in FIG. 6.

In the particular case of the Y-decoder 500 of FIG. 5, the resulting Yd signal is applied to the gates of transistors P504 and N500, and the ICLK signal is applied to the gates of transistors P500 and N502, and to the delay circuit 502. The ICLK signal is thus shown to transition from low-to-high at time t3. In the event the Yd signal and ICLK signal are both high, transistor N500 turns on, while transistor P504 turns off. In addition, transistor P500 turns off and transistor N502 turns on. Consequently, the input of inverter 504 is driven low, resulting in the Yj signal being driven high. The Yj signal is shown to transition high at time t4.

Referring back to FIG. 1, within the semiconductor memory device 100, an applied row address (X-address) is decoded by an X-decoder (not shown) resulting in the activation of a word line (such as 122) in synchronism with the ICLK signal. This is illustrated by the waveform WL transitioning high in FIG. 6. The activation of a word line results in a memory cell (such as 128) being selected for a read or write operation. FIG. 6 illustrates a write operation. Accordingly, the WB and RB waveforms illustrate the response of the write bus and read bus for a write operation. During a write operation, one of the write bus lines (WB or /WB) is driven to the GND voltage. Within the read bus, a corresponding read bus line (RB or /RB) will fall, but not fall more than one Vtp above the GND supply voltage, where Vtp is the threshold voltage of transistors P100 and P102. While not shown in FIG. 6, the potential of the selected bit line pair changes in nearly the same manner as the write bus.

Following the low-to-high transition in the CLK signal, the CLK signal transitions from high to low after the completion of the write operation. This is shown at time t5 in FIG. 6. In response to the falling CLK edge, the ICLK signal transitions low at time t6. In addition, the pre-charge signal φ and the selected word line WL will also fall to a low logic level. With the selected word line WL low, the memory cell (such as 128) is de-selected. With the pre-charge signal φ low, the pre-charging circuits (such as 106 and 108) are enabled.

In the case of FIG. 5, as the ICLK signal falls, transistor N502 is turned off, while transistor P500 is turned on. However, due to the delay introduced by delay circuit 502, transistor P502 remains turned off. Accordingly, the input of inverter 504 remains low and the Yj signal remains high. The high Yj signal results in transistors P100, P102, N100 and N102 within the column selecting circuit 102 remaining on. In this arrangement, the selected bit lines (BL and /BL) are pre-charged by bit line pre-charging circuit 106, pre-charging circuit 108, and the write amplifier 112.

In the event the Y-decoder of FIG. 5 is employed, at time t7, following the delay introduced by delay circuit 502, transistor P502 is turned on. Because transistor P500 is already turned on, the input to inverter 504 is pulled to the Vcc level. Consequently, the Yj signal transitions low. As a result, the transistors (P100, P102, N100 and N102) within the column selecting circuit 102 are turned off, isolating the bit lines from the pre-charging circuit 108 and the write amplifier 112. Thus, the pre-charging functions provided by the pre-charging circuit 108 and write amplifier 112 are terminated. However, because the pre-charge signal φ remains low, the bit lines continue to be pre-charged by bit line pre-charging circuit 106 until the pre-charge signal φ returns high.

In this way, following the completion of a write operation, a Y-decode signal (such as Yj) provided by a Y-decoder (such as 120) remains active (high). This allows bit lines (such as 104a and 104b) to be pre-charged by a pre-charging circuit (such as 108) and write amplifier (such as 112). As a result, write recovery time can be shortened and high-speed access to a memory cell enabled, without the risk of mis-reading or mis-writing.

Figure 7:
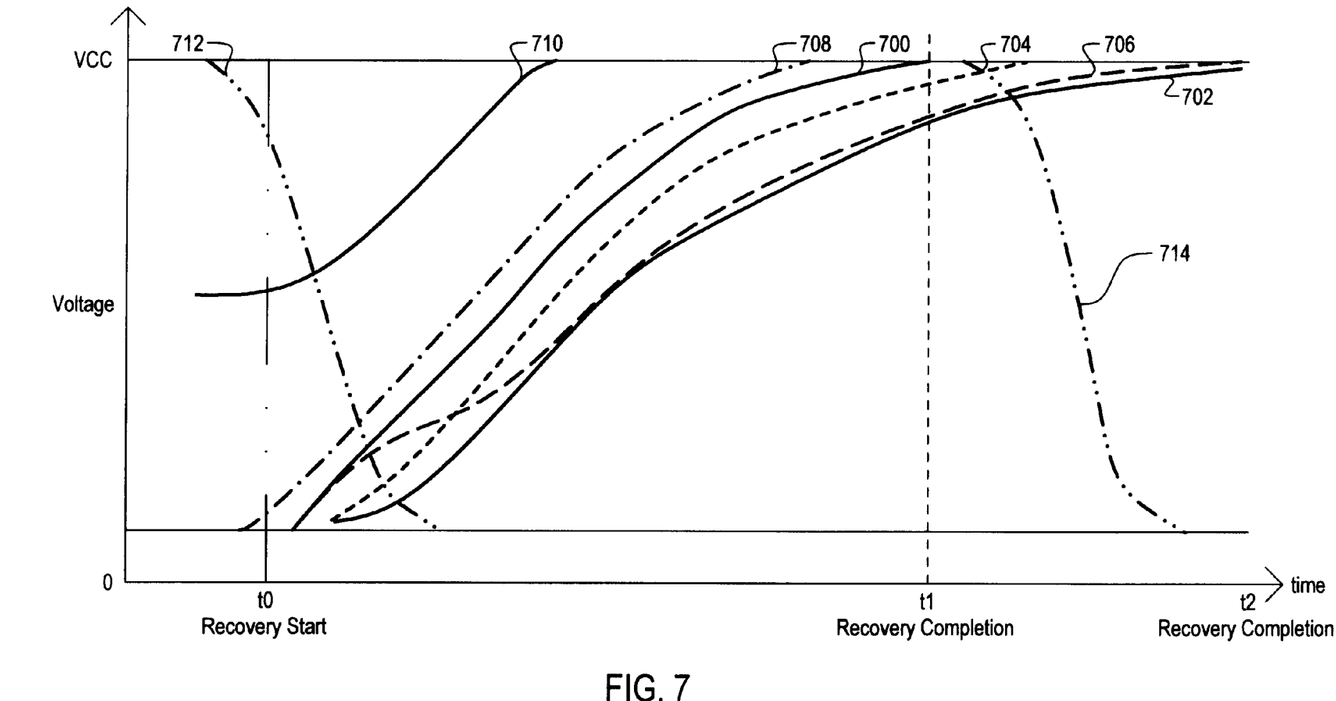
FIG. 7 is a timing diagram illustrating the relationship between bit line potentials and a write recovery time.

Referring now to FIG. 7, a timing diagram is set forth illustrating the relationship between bit line potentials and a write recovery time. FIG. 7 includes a number of waveforms generated according to different pre-charging approaches utilizing the circuits set forth in FIG. 1.

Waveform 700 illustrates the response of a bit line that is pre-charged by bit line pre-charging circuit 106, pre-charging circuit 108, and write amplifier 112.

Waveform 702 illustrates a bit line that is pre-charged when transistors P100, P102, N100 and N102 are turned off. As a result, the bit line is pre-charged only by the bit line pre-charging circuit 106.

Waveform 704 illustrates a bit line that is pre-charged when transistors N100 and N102 are turned off. As a result, the bit line is pre-charged by the bit line pre-charging circuits 106 and 108, and not the write amplifier 112.

Waveform 706 illustrates a bit line being pre-charged when transistors P100 and P102 are turned off. As a result, the bit line is pre-charged by the bit line pre-charging circuit 106 and write amplifier 112, and not pre-charging circuit 108.

Waveform 708 illustrates a write bus line being pre-charged when transistors N100 and N102 are turned off. As a result, the write bus line is pre-charged only by the write amplifier 112.

Waveform 710 illustrates a read bus line being pre-charged when transistors P100 and P102 are turned off. As a result, the word line is pre-charged only by the pre-charging circuit 108.

Waveform 712 illustrates the falling edge of a pre-charge signal +that activates the pre-charge circuits (106 and 108), and the falling edge of a word line that de-selects a memory cell.

Waveform 714 illustrates the falling edge of a column select signal Yj, which can activate and de-activate the transistors (P100, P102, N100 and N102) of the column selecting circuits.

It is noted that semiconductor memory devices have tended to have increasing numbers of data I/O terminals (such as 130 in FIG. 1 and 230 in FIG. 2). For example, while a semiconductor memory device may have the same number of bit lines, the number of data I/O terminals can increase from 32 to 128. Consequently, the number of bit lines connected to a given read or write bus is reduced, resulting in shorter read and write buses. Shorter read and write buses have smaller parasitic capacitance, and thus can be charged at a more rapid rate than a bit line. This is illustrated by comparing the bit line waveform 702 with the bus waveforms (708 and 710). Thus, the circuits used for pre-charging the read and write buses can be considered to have sufficient drive capability for accomplishing the desired pre-charge performance.

As illustrated by the waveform 706, when a bit line is pre-charged by way of a write bus 126 through NMOS transistors N100 and N102, and a bit line pre-charging circuit 106, the bit line potential will rise rapidly, but the charging rate will slow as the potential approaches Vcc. Conversely, as illustrated by waveform 704, when a bit line is pre-charged by way of a read bus 124 through PMOS transistors P100 and P102, and a bit line pre-charging circuit 106, the bit line initially charges at a slow rate than the case illustrated by waveform 706, but the charging rate increases as the potential approaches Vcc.

Thus, in the disclosed embodiments, a bit line can be pre-charged not only by a bit line pre-charging circuit 106, but with a write amplifier 112 or a read bus pre-charging circuit 108, as well. This can reduce write recovery times. In addition, a bit line can be pre-charged by a bit line pre-charging circuit 106, a read bus associated bit line pre-charging circuit 108, and a write amplifier 112.

Referring once again to FIG. 7, if time t0 is assumed to be a write recovery start time, time t1 can be considered a first write recovery completion time that corresponds to a pre-charge operation by bit line pre-charging circuit 106, pre-charging circuit 108, and write amplifier 112. Time t2 can be considered a second write recovery completion time that corresponds to a pre-charge operation by only a bit line pre-charging circuit 106. The resulting write recovery periods can be compared as follows.

$$(t1-t0)/(t2-t0)=0.7.$$

Thus, the write recovery period represented by waveform 700 is 70% of the write recovery period represented by waveform 702. Accordingly, by pre-charging a bit line with a bit line pre-charging circuit 106, a read bus pre-charging circuit 108, and a write amplifier 112, as taught by the first and second embodiments (100 and 200), the write recovery time can be reduced by 30% over the conventional arrangement illustrated by waveform 702.

Figure 8A:
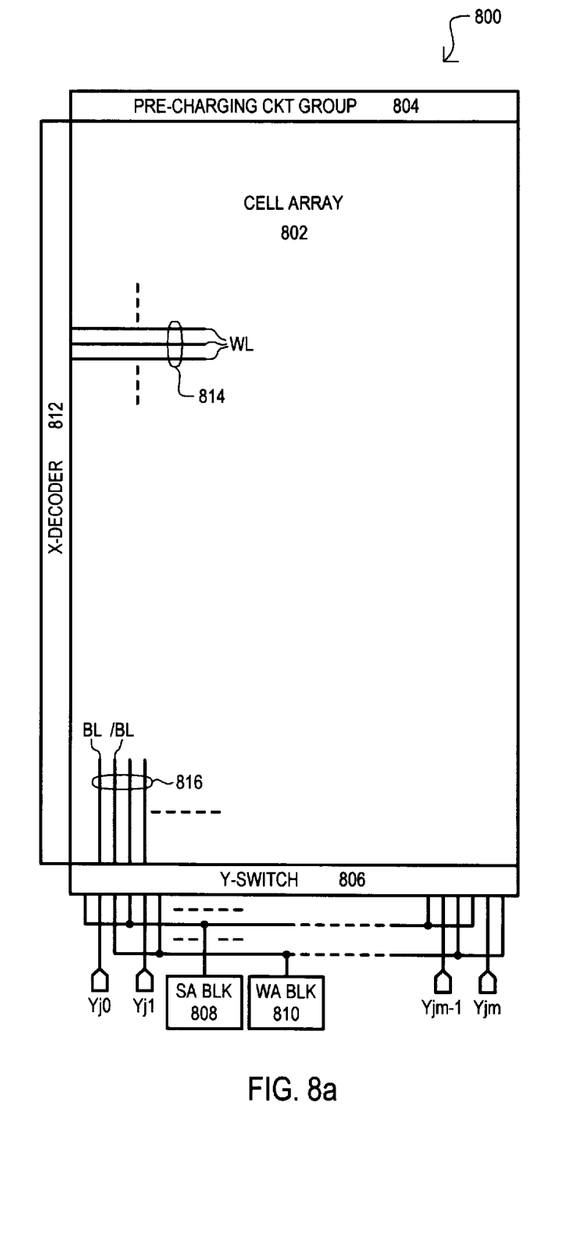
FIGS. 8a and 8b are general layout diagrams illustrating one way in which the general circuit components described in FIGS. 1 and 2 can be arranged on a semiconductor integrated circuit.
Figure 8B:
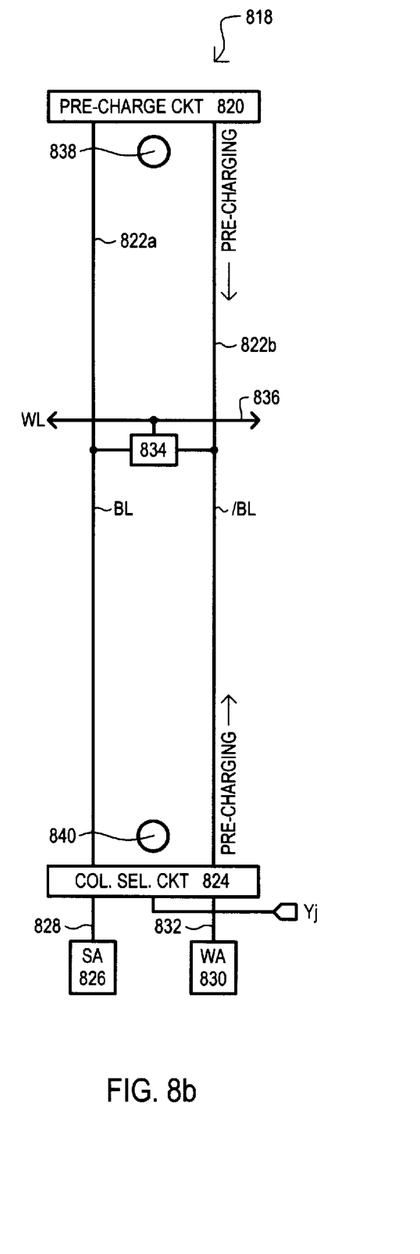

Referring now to FIGS. 8a and 8b, general layout diagrams are set forth, illustrating one way in which the general circuit components described in FIGS. 1 and 2 can be arranged on a semiconductor integrated circuit (chip).

FIG. 8a is a portion of a chip that is designated by the general reference character 800. The chip portion 800 is shown to include a memory cell array 802 disposed generally in the center of FIG. 8a and a pre-charging circuit group 804 disposed on one side of the memory cell array 802 (the upper side in the view of FIG. 8a). A Y-switch 806, that can include a number of column selecting circuits, a sense amplifier block 808, and a write amplifier block 810 are disposed on another side of the memory cell array 802 (the lower side in the view of FIG. 8a). In addition, FIG. 8a further illustrates an X-decoder 812, that can select word lines within the memory cell array 802, that is disposed on yet another side of the memory cell array 802 (the left lateral side in the view of FIG. 8a). The sense amplifier block 808 includes at least one sense amplifier. Similarly, the write amplifier block 810 includes at least one write amplifier. The particular arrangement of the write amplifiers within the write amplifier block 810, and the particular arrangement of the sense amplifiers within the sense amplifier block 808 will depend upon how the memory cell array 802 is divided. Also set forth in the view of FIG. 8a are exemplary word lines 814 (WL) and bit lines 816 (BL and /BL).

FIG. 8b is a layout diagram illustrating a bit line pair for the structure set forth in FIG. 8a. The arrangement of FIG. 8b is designated by the general reference character 818, and is shown to include a pre-charging circuit 820, a pair of bit lines 822a and 822b, and a column selecting circuit 824. A sense amplifier 826 is coupled to the bit lines (822a and 822b) by way of a read bus 828 and the column selecting circuit 824. A write amplifier 830 is coupled to the bit lines (822a and 822b) by way of a write bus 830 and the column selecting circuit 824. While not shown in FIG. 8b, it is understood that another pre-charging circuit can be connected to the read bus 828.

Also set forth in FIG. 8b is a memory cell 834 and its associated word line 836. In addition, a memory cell location close to the pre-charging circuit 820 is indicated by the reference character 838, and a memory cell location close to the column selecting circuit 824 is indicated by the reference character 840.

Because a bit line portion in the vicinity of location 838 is close in proximity to the pre-charging circuit 820, it can be pre-charged rapidly by pre-charging circuit 820. In contrast, because a bit line portion in the vicinity of location 840 is relatively far from pre-charging circuit 820, it requires more time for a rising voltage to propagate to the location from the pre-charging circuit 820. Thus, pre-charging circuit 820 by itself cannot charge the bit line portion in the vicinity 840 as rapidly as it can charge the bit line portion in the vicinity 838. However, because the bit line portion in the vicinity 840 is close in proximity to the read bus 828 and write bus 832, the bit line portion in the vicinity 840 can be rapidly pre-charged by a pre-charging circuit connected to the read bus 828 and/or the write amplifier connected to the write bus 832. Such a pre-charging operation would occur by way of the column selecting circuit 824.

In this way, a pre-charging circuit 820 can be disposed on one end of a bit line (822*a* and 822*b*) while another pre-charging circuit and a write amplifier 830 can be disposed at the other end of a bit line. Thus, the bit line can be pre-charged by a pre-charging circuit 820 from one end of the bit line, and by another pre-charge circuit and/or a write amplifier 830 from the other end of the bit line. In this arrangement, regardless of the position of a memory cell within a memory cell array, the bit line portion in the vicinity of the memory cell can be pre-charged rapidly. This can allow for more rapid write recovery times. It is understood that in the particular arrangement of FIG. 8*b* pre-charging by the write amplifier 830 or a pre-charging circuit connected to the read bus 828 is performed through the column selecting circuit 824.

It is also understood that it is not necessary to provide a pre-charging circuit for every bit line (BL), and that at least one pre-charging circuit may be provided for a read bus.

It is understood that while particular approaches to generating a Y-select signal, such as Yj (and /Yj) have been disclosed, this should not be construed as limiting the present invention to such limited approaches. In particular, circuits have been described that provide an extended Yj signal that is generated in response to the rising edge of an external clock signal CLK and/or a change in address. However, as just one example, the completion of a write operation could be detected by other ways to provide a detection signal. The detection signal could then be used to activate a Y-select signal for a given period to time.

As described by the disclosed embodiments, a bit line pre-charging arrangement can include a first pre-charging circuit that pre-charges a bit line after data is written into a memory cell connected to the bit line. In addition, a second pre-charging circuit (that can be a write amplifier) can also pre-charge the bit line by way of a read bus or write bus after data has been written into the memory cell connected to the bit line.

In addition, the disclosed embodiments also illustrate how a pre-charging circuit on a read bus and a pre-charging circuit on a write bus can be activated together to pre-charge a bit line, and thereby reduce a write recovery time period.

Furthermore, the disclosed embodiments illustrate an arrangement in which pre-charging of a bit line can occur through a read bus and a write bus, with one bus (read or write) being connected to the bit line by an NMOS device while the other bus (write or read) is connected to the bit line by a PMOS device. In this arrangement initial pre-charging operations can rapidly occur through the NMOS devices, and as the bit lines approach the pre-charge voltage, rapid pre-charging operations can occur through the PMOS devices. This allows for more efficient, and/or higher speed pre-charging operations.

Still further, the disclosed embodiments illustrate how a bit line pre-charging circuit and a column selecting circuit can be situated apart from one another with respect to a bit line. With pre-charging occurring by the bit line pre-charging circuit and through the column selecting circuit, the bit line portions can be pre-charged rapidly, regardless of the position of the bit line portion within an array. This can make the use of additional pre-charge circuits unnecessary, and in addition, provide higher speed write recovery time periods.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device having a plurality of memory cells, word lines for selecting the memory cells in a row direction, bit lines for selecting the memory cells in a column direction, and a data bus for providing access to the memory cells through the bit lines on the basis of a clock signal, the semiconductor memory device comprising:

first pre-charging means for pre-charging at least one bit line after data is written into a memory cell; and second pre-charging means for pre-charging the data bus after data is written into the memory cell; wherein the at least one bit line is pre-charged by the first pre-charging means and the second pre-charging means.

2. The semiconductor memory device of claim 1, wherein:

the data bus includes a read bus for reading data in the memory cells through the bit lines on the basis of the clock signal.

3. The semiconductor memory device of claim 1, wherein:

the data bus includes a write bus for writing data to the memory cells through the bit lines on the basis of the clock signal.

4. The semiconductor memory device of claim 1, further including:

the data bus includes a write bus for writing data to the memory cells through the bit lines on the basis of the clock signal, and a read bus for reading data in the memory cells through the bit lines on the basis of the clock signal;

at least one transistor of a first conductivity type disposed between the read bus and the at least one bit line; and at least one transistor of a second conductivity type disposed between the write bus and the at least one bit line.

5. The semiconductor memory device of claim 4, wherein:

the at least one transistor of a first conductivity type includes an n-channel insulated gate field transistor (IGFET); and the at least one transistor of a second conductivity type includes a p-channel insulated gate field transistor (IGFET).

6. The semiconductor memory device of claim 4, further including:

the at least one transistor of the first conductivity type and the at least one transistor of the second conductivity type being activated in response to a column select signal pulse; and means for extending a column select pulse beyond the completion of a write operation to a memory cell.

7. The semiconductor memory device of claim 6, wherein:

the means for extending a column select pulse includes
a delay circuit for delaying the clock signal,
a logical sum circuit that outputs the logical sum of the clock signal and the delayed clock signal, and a logical product circuit that outputs the logical product of the output of the logical sum circuit and a column select signal.

8. The semiconductor memory device of claim 6, wherein:

the means for extending a column select pulse includes
a delay circuit for delaying the clock signal, and
a logical product circuit that outputs the logical product of the delayed clock signal and a column select signal.

9. The semiconductor memory device of claim 4, further including:

column select signal generating means for outputting a column select signal that selects at least one bit line; and signal output means for outputting a signal for a predetermined period of time after the completion of a write operation to a memory cell;

wherein the at least one transistor of a first conductivity type and the at least one transistor of a second conductivity type are driven by the column select signal and the signal output from the signal output means.

10. The semiconductor memory device of claim 4, wherein:

the first pre-charging means are disposed apart from the at least one transistor of a first conductivity type and the at least one transistor of a second conductivity type, with respect to the at least one bit line.

11. The semiconductor memory device of claim 4, wherein:

the first pre-charging means are disposed at one end of the at least one bit line; and the at least one transistor of a first conductivity type and the at least one transistor of a second conductivity type are disposed at the other end of the at least one bit line.

12. The semiconductor memory device of claim 1, wherein:

the clock signal is an externally applied clock signal.

13. The semiconductor memory device of claim 1, wherein:

the bit lines are selected according to applied address signals; and the clock signal is generated according to variations in the applied address signals.

14. A semiconductor memory device, comprising:

at least one bit line pair;

a write bus having at least two write bus lines;

a column selecting circuit that couples the at least one bit line pair to the write bus;

a write amplifier, the write amplifier having a data drive mode and a pre-charge mode, the write amplifier driving the write bus lines with complementary data values in the data drive mode, driving the write bus lines with the same pre-charge data values and driving the at least one bit line pair through the column selecting circuit to the same pre-charge data value in the pre-charge mode.

15. The semiconductor memory device of claim 14, further including:

a read bus;

a pre-charge circuit coupled to the read bus; and the column selecting circuit having select transistors of a first conductivity type that couple the at least one bit line pair to the write bus, and select transistors of a second conductivity type that couple the at least one bit line pair to the read bus.

16. The semiconductor memory device of claim 14, wherein:

the write amplifier includes
a first logic gate that receives a write enable signal and a data value, and
a second logic gate that receives a write enable signal and an inverse data value.

17. A semiconductor memory device, comprising:

a memory cell array including at least one bit line, the at least one bit line having a first end and a second end;

a bit line pre-charge circuit coupled to the at least one bit line, the bit line pre-charge circuit charging the at least one bit line to a pre-charge voltage in a pre-charge operation;

a write bus coupled to the second end of the at least one bit line; and a write bus pre-charge circuit coupled to the write bus, the write bus pre-charge circuit charging the at least one bit line to a pre-charge voltage in the pre-charge operation.

18. The semiconductor memory device of claim 17, wherein:

the write bus is coupled to the at least one bit line by a column selecting circuit, the column selecting circuit enabling a low impedance path between the write bus and the at least one bit line in the pre-charge operation.

19. The semiconductor memory device of claim 18, wherein:

the write bus pre-charge circuit is a write amplifier.

20. The semiconductor memory device of claim 17, further including:

a read bus coupled to the at least one bit line;

a read bus pre-charge circuit coupled to the at least one bit line, the read bus pre-charge circuit charging the at least one bit line to the pre-charge voltage in the pre-charge operation.

21. A semiconductor memory device, comprising:

a bit line pair connected to at least one memory cell;

a write bus line pair;

a read bus line pair;

a bit line precharge circuit precharging the bit line pair;

a write bus line precharge circuit precharging the write bus line pair; and a read bus line precharge circuit precharging the read bus line pair, said bit line pair being precharged by each of the bit line precharge circuit, the write bus line precharge, and the read bus line precharge circuit.

22. The semiconductor memory device of claim 21, further comprises a column selecting circuit for electrically connecting the bit line pair to the write bus line pair and the read bus line pair in response to an active state of a column selection signal, the read bus line precharge circuit precharging the read bus line pair in response to an active state of a precharge control signal, both of the column selection signal and the precharge control signal being in the active state during a predetermined period.

23. The semiconductor memory device of claim 22, the bit line precharge circuit precharging the bit line pair in response to the active state of the precharge control signal.

24. The semiconductor memory device of claim 23, the write bus line precharge circuit precharging the write bus line pair after a write operation to the memory cell is completed.

* * * * *